United States Patent [19]

Simmons

[11] 4,137,504
[45] Jan. 30, 1979

[54] DIGITAL FILTER

[75] Inventor: Elmer C. Simmons, Whitman, Mass.

[73] Assignee: Digital Equipment Corporation, Maynard, Mass.

[21] Appl. No.: 824,030

[22] Filed: Aug. 12, 1977

[51] Int. Cl.² .............................................. H03K 1/10
[52] U.S. Cl. .................................... 328/165; 328/112; 328/127
[58] Field of Search ............... 328/111, 112, 127, 165; 307/234

[56] References Cited

U.S. PATENT DOCUMENTS

| | | | |
|---|---|---|---|
| 3,138,759 | 6/1964 | Thompson | 328/112 |
| 3,231,823 | 1/1966 | Garfield et al. | 328/165 |
| 3,600,688 | 8/1971 | Booth | 328/111 |
| 3,822,385 | 7/1974 | Kayalioglu | 307/234 |
| 4,030,010 | 6/1977 | Schwartz | 307/234 X |

Primary Examiner—John S. Heyman
Attorney, Agent, or Firm—Paul E. Kudirka; John M. Gunther; Thomas C. Siekman

[57] ABSTRACT

A circuit for filtering electrical waveforms in which the useful information is contained in patterns and spacing of zero-voltage crossings is disclosed. Illustratively, a disk memory system is disclosed in which the voltage peaks developed by the disk memory read-transducers are converted into zero-voltage crossing waveforms by differentiation. To eliminate false zero-voltage crossings caused by noise, the digital filter generates a linear ramp waveform whose magnitude is proportional to the time duration between successive zero-voltage crossings. False zero crossings typically have a short time duration between successive crossings. They are eliminated from the integrated ramp waveform by a comparator which only responds when the integrated waveform reaches a predetermined threshold level indicating the time between successive zero-voltage crossing exceeds a minimum time duration. A balanced version of the digital filter circuitry is also disclosed which recovers a limited, filtered version of the original zero-voltage crossing wave form except for a slight delay.

4 Claims, 3 Drawing Figures

DIGITAL FILTER

BACKGROUND OF THE INVENTION

1. The Field of the Invention

This invention relates to electronic filter circuits and more particularly in electronic circuits for filtering electrical wave forms where information is contained in patterns and time spacing of zero-voltage crossings.

2. Description of the Prior Art

Many present day data processing and computer systems utilize a magnetic memory in which digital information is written onto a magnetic disk that is rotated at high speeds. In such magnetic memory systems, the rotating disk is coated with a magnetic material and digital information is encoded on the disk surface by selectively magnetizing the portions of the surface by means of an electromagnetic transducer arrangement. Digital information is normally recorded in a serial track on the rotating disk surface as it passes beneath the recording transducer. Typically, a magnetic encoding pattern is used in which the direction of the magnetic field changes rapidly along the length of the track. This rapidly changing magnetic pattern is called a "flux reversal," and the digital information is normally encoded in the spacing and patterns of the flux reversals.

Digital information is normally read out of a magnetic disk memory by placing a second magnetic transducer close to the magnetic disk surface. As the flux reversals recorded on the disk surface move past the transducer a voltage waveform is induced in the transducer which waveform has a series of positive and negative peaks.

The digital information is then recovered from the read-voltage waveform by differentiation. Voltage peaks in the original waveform are converted by differentiation into zero-voltage crossings since the derivative of the read-voltage waveform never goes to zero except at the peaks. The zero-voltage crossings may be easily detected by well-known means and used to develop a waveform representative of the stored digital information.

Such a magnetic recording system provides for substantial noise immunity, because noise which does not produce a false zero crossing of the read-signal derivative has almost no effect. However, with some data patterns and particularly with high resolution read transducers, the slope of the read-signal voltage between peaks is flat enough so that its derivative has a very low amplitude. At this low point of the derivative the signal is particularly susceptible to noise which causes false zero crossings.

Prior art magnetic disk systems often identified valid and invalid zero crossings by means of amplitude discriminating circuits. However, a problem in the prior art arose because amplitude discrimination circuits had to have high resolution in order to properly discriminate between invalid zero crossings and valid pulses with low amplitude. Such circuits were, therefore, complicated and expensive.

SUMMARY OF THE INVENTION

The foregoing problem and others have been solved in one illustrative embodiment in which a digital filter discriminates between valid and invalid zero-voltage crossings by means of time discrimination. Basically, the derivative waveform containing the zero-crossing information is first limited to produce a digital pulse waveform. This waveform contains pulses of equal magnitude whose duration depends on the time interval between successive zero-voltage crossings. The waveform is then integrated by an integration circuit to produce a time-base waveform. Pulses of longer time duration produce a higher amplitude voltage at the output of the integrator. The integrator output voltage is subsequently processed by a comparator which only produces an output when the integrator voltage rises above a threshold voltage. Thus pulses with a time duration of less than a predetermined value produce no output of the comparator.

False zero crossings in general have a relatively short duration, that is, the time interval between successive zero crossings is short relative to the time interval between zero crossings of the valid information. Thus, invalid zero crossings produce a low amplitude at the integrator ouput because of their short duration. This low amplitude is below the threshold voltage and no output is produced by the comparator. The filter therefor does not respond to such false signals.

In order to generate a pulse waveform which is analogous to original input waveform without alterations in the spacing or patterns of zero-voltage crossings, the illustrative circuitry utilizes a pair of integrators and comparators to operate on the limited differentiated zero-crossing waveform and its complement. The outputs of the comparators are then used to set and reset a flip-flop, which generates a limited version of the zero-crossing waveform with the correct time spacing.

DETAILED DESCRIPTION

Figure 1:
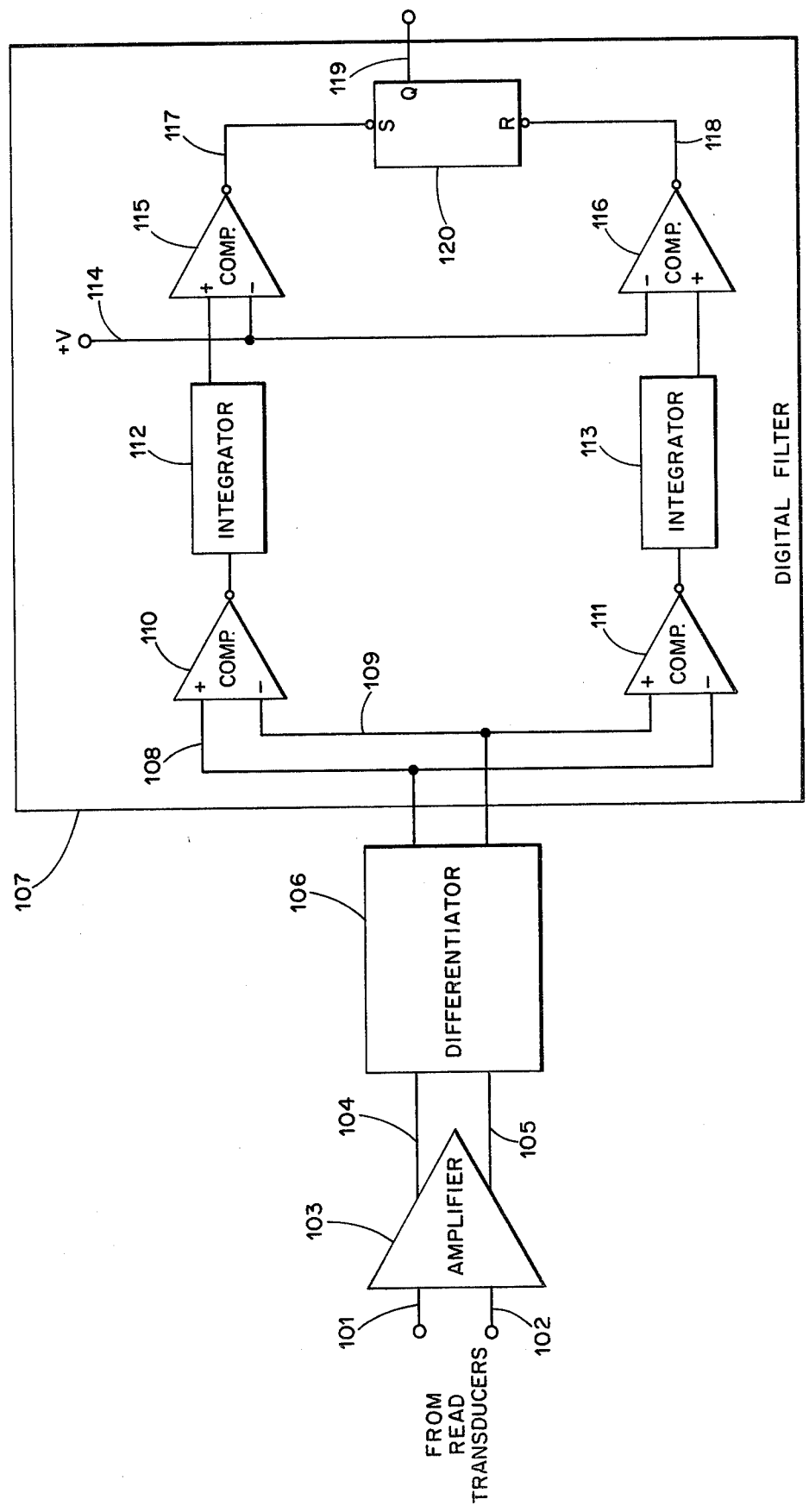
FIG. 1: Shows a block diagram of the illustrative digital filter in a magnetic memory read circuit.

FIG. 1 of the drawing shows an illustrative digital filter connected in series with a read circuit for a magnetic memory. The circuit is arranged in a differential configuration in order to maximize noise immunity and minimize the effect of propagation delays. The inventive circuitry in FIG. 1 is contained in the heavy-lined box 107. The remainder of the circuitry is well known in the art and forms no part of the present invention. This circuitry is shown only to supplement an understanding of the invention and provide clarity in description.

An alternating voltage signal produced by the memory read transducers is developed on leads 101 and 102 and applied to the input of amplifier 103. Amplifier 103 amplifies the signals produced by the read transducers (which may be on the order of mili-volts) into a level sufficient to operate the rest of the circuitry. Amplifier 103 also may illustratively include low-pass filter circuitry in order to eliminate noise developed in the read transducers. This circuitry is well known in the art and will not be described further herein. The outputs of amplifier 103 are applied via leads 104 and 105 to differentiator 106. As mentioned previously, flux reversals on the magnetic disk which encode the digital information are indicated by positive and negative peaks in the read-signal waveform. Since the only place that the read signal exhibits a zero voltage slope is at the peaks, differentiator 106 is provided to convert the peaks into zero-voltage crossings. The zero-voltage crossings may then be easily processed by conventional integrated circuitry into pulses. Differentiator 106 may be any of several well-known designs, including resistor capacitor highpass circuitry, or delay line subtraction differentiator circuitry. The differentiated read signal is applied to filter 107 by differentiator 106 on lead 108. An inversion of the differentiated read signal appears on lead 109.

The differentiated read signal on lead 108 is applied to the positive input of comparator 110 and the negative input of comparator 111. Similarly, the inverted differentiated signal on lead 109 is provided to the negative input of comparator 110 and the positive input of comparator 111. Comparators 110 and 111 are well-known digital circuit devices which effectively limit the differentiated signal to produce a squared output. Positive peaks are converted to pulses with a first constant voltage level and a time duration proportional to the duration between successive zero-voltage crossings. Negative peaks are similarly converted to pulses with a second constant voltage level. Zero crossings are, of course, converted into positive and negative voltage transitions or edges of the squared waveform.

The outputs of comparators 110 and 111 are provided to integrators 112 and 113 respectively. Integrators 112 and 113 convert the limited waveform produced by comparators 110 and 111 into a time-based linear-ramp waveform in which the amplitude of the ramp depends upon the time duration of the limited waveform pulses produced by comparators 110 and 111.

The ramp waveform produced by integrator 112 is applied to one input of comparator 115. The other input of comparator 115 is connected to reference voltage source V via lead 114. Thus, only read signal voltage pulses of sufficient duration to cause the output of integrator 112 to increase to voltage V will cause comparator 115 to respond. Comparator 115 thereupon applies a set signal to flip-flop 120 via lead 117. Flip-flop 120 develops an output lead on 119 which is then processed by the remainder of the read circuitry.

Similarly the ramp waveform output of integrator 113 is applied to the positive input of comparator 116. Comparator 116 also receives the reference voltage V as negative input. The output of comparator 116 is applied to the reset input of flip-flop 120 via lead 118.

As will hereinafter be explained, flip-flop 120 is set by comparator 115 in response to a positive voltage signal appearing at the input to digital filter 107 and is reset by comparator 116 in response to a negative voltage pulse applied to digital filter 107. Therefore, a digital waveform is produced at output 119 with a pulse width corresponding to the time intervals between successive zero crossings.

False zero crossings that are relatively short in duration do not cause integrators 112 and 113 to produce a sufficient output voltage to cause comparator 115 and 116 to respond. The false signals, therefore, do not appear at output 119.

Figure 2:
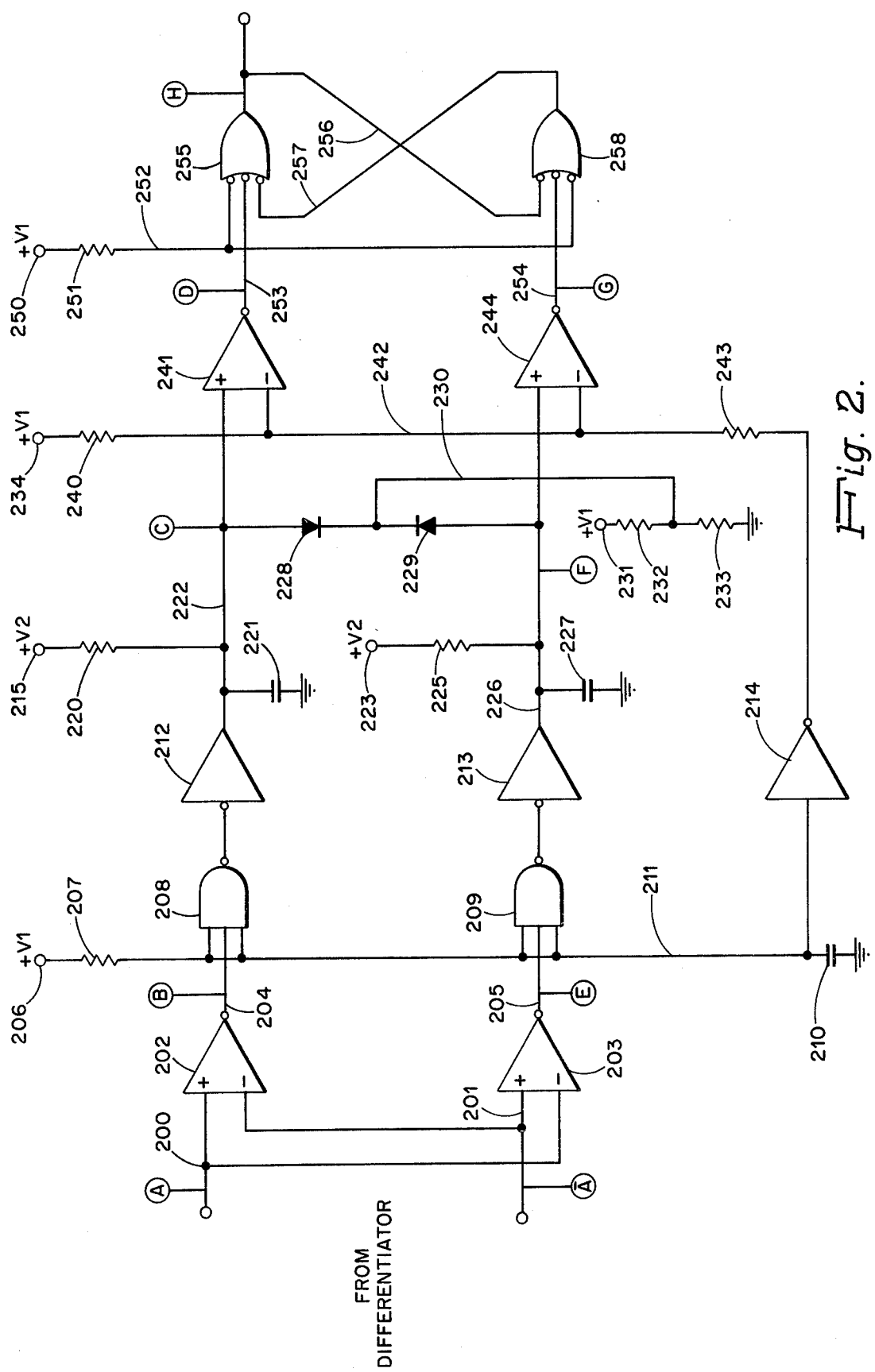
FIG. 2: Shows the circuitry of the illustrative digital filter.

Referring now to FIG. 2, a more detailed circuit diagram of the digital filter is shown. For a better understanding of the operation of the circuitry, it may be helpful to refer to FIG. 3 from time to time which figure shows various voltage waveforms at points designated by circled letters on FIG. 2.

As previously explained, a differentiated read signal is applied via lead 200 to the positive input of comparator 202. A typical differentiated read signal is shown in line A in FIG. 3. An invalid zero crossing is contained at time $t_1$ in the differentiated read signal. As will hereinafter be explained, the illustrative digital filter operating in accordance with the principles of this invention processes signal A to eliminate the invalid zero crossing at time $t_1$. The inverse of signal A (designated as $\overline{A}$) is applied via lead 201 to the negative input of comparator 202. Comparator 202 is a well-known integrated circuit device which produces a low output when a signal appearing at its positive input is larger in magnitude then a signal appearing at its negative input. The output 204 of comparator 202 thus produces an inverted limited version of signal A which is shown in line B of FIG. 3. As shown in line B, the positive peaks of voltage waveform A have been converted into zero voltage levels, the negative peaks of waveform A have been converted into positive voltage levels and the zero crossings of waveform A have been converted into voltage transitions or edges of waveform B.

Similarily, voltage waveforms A and $\overline{A}$ are applied to the negative and positive inputs of comparator 203 via leads 200 and 201 respectively. Responsive thereto, comparator 203 produces an output 205 corresponding to line E in FIG. 3 which is just the inverse of line B.

The limited waveform B, which is the output of comparator 202, is applied to the middle input of 3 input NAND gate 208. The remaining 2 inputs of NAND gate 208 are connected to voltage V1 from source 206 via resistor 207 (capacitor 210 provides noise filtering at the inputs of NAND gate 208). Thus, with two of its three inputs high, NAND gate 208 acts as an invertor which inverts waveform B. Similarly, waveform E is inverted by NAND gate 209.

The output of NAND gate 208 is applied to open-collectored buffer invertor 212 which in turn controls the integration circuitry consisting of resistor 220 and capacitor 221. Buffer 212 isolates the limiter circuitry from the integration circuitry.

Resistor 220 and capacitor 221 form a simple RC integrator circuit in which capacitor 221 charges from voltage source 215 through resistor 220. Voltage V2 from voltage source 215 is assumed to be high enough so that capacitor 221 charges almost linearly. A suitable voltage for voltage V2 may illustratively be 15 volts. Thus, output 222 of open-collectored buffer invertor 212 appears as a ramp input as shown as line C on FIG. 3. Each ramp starts when the output of comparator 202 goes low. Note that the height of each ramp depends on the width of the voltage pulse which is developed by comparator 202. Thus, the limited waveform B is in effect converted converted to a time-base waveform by the integration circuitry. Normally the ramp waveform is returned to zero at the end of each pulse in waveform B. To prevent the voltage on lead 222 from overloading the input of comparator 241 in the case of malfunction, diode 228 clamps the voltage appearing on output 222 of inverter 212 to a predetermined limiting voltage. The limiting voltage is produced on lead 230 from voltage source 231 and a resistive divider consisting of resistors 232 and 233. The limiting voltage is high enough so as not to interfere with the normal operation of the circuitry.

The inverted limited signal at the output of NAND gate 209 processed in a manner similar to the non-inverted signal. Specifically, the output of NAND gate 209 is applied to open-collectored buffer invertor 213 which in turn, via output 226, controls the integration circuitry consisting of resistor 225 and capacitor 227. This integration circuitry has the same time constant as the inverter circuitry consisting of resistor 220 and capacitor 221. Diode 229 clamps the output of invertor 213 via lead 230 to the limiting voltage derived from voltage source 231 and the resistive divider. The voltage waveform developed at the output of invertor 213 is shown in line F of FIG. 3. Again, the height of each ramp is proportional to the duration of the voltage pulse developed by comparator 203.

Ramp waveforms C and F are applied to the positive inputs of comparators 241 and 244 respectively. These comparators eliminate short time duration pulses by rejecting any ramp waveform where the maximum voltage is less than a predetermined threshold. Advantageously, invalid noise signals are thereby rejected.

Accordingly, the negative inputs of each comparator are connected via resistor 240 and lead 242 to voltage source 234 which applies a reference voltage V1. Comparator 241, therefore, responds by placing a low signal on its output 253 when the ramp signal generated by the integrator consisting of resistors 220 and capacitor 221 equals or exceeds the reference voltage V1 developed by voltage source 234. This shown in FIG. 3, lines C and D.

In order to compensate for offsets developed in the integration circuitry, inverter 214 and resistor 243 are provided. Specifically, at the end of each limited voltage pulse produced by comparators 202 and 203 the outputs of NAND gates 208 and 209 become high as previously explained. With their inputs high, buffer inverters 212 and 213 apply a low signal to their respective integrators to provide a starting point for the increasing ramp signal. However, the low signal applied to the integration circuitry by inverters 212 and 213 may not be exactly at ground voltage due to small voltage offsets found in typical integrated circuitry. Furthermore, these voltage offsets may vary with temperature and other factors. Thus the starting points for the ramp waveforms shown in lines C and F of FIG. 3 may vary, which may in turn vary the time based signal which is developed by the integration circuitry.

Accordingly, buffer inverter 214 is provided, which inverter is illustratively the same type of integrated circuit as inverters 212 and 213 and thus develops the same type of offsets. Inverter 214 has its input tied to high voltage source 206 via resistor 207 and thus applies a low signal, including an offset, to its output. The low signal, including the offset, is added to the reference voltage V1 produced by source 234 via resistors 240 and 243. The sum of the reference voltage V1 and the voltage offset produced by inverter 214 is applied as a reference voltage to the negative inputs of comparators 241 and 244. Thus if, due to a voltage offset in inverters 212 and 213, the integration circuitry does not start at ground voltage, the same offset is added to the reference voltage at comparators 241 and 244. Thus the time taken by the integrators to charge to the reference voltage plus the offset will be independent of the offset.

A low signal produced on the output lead 253 of comparator 241 is applied to the middle input of NAND gate 255. NAND gate 255 forms part of a set-reset flip-flop in conjunction with NAND gate 258. The low signal applied to the middle input of gate 255 causes a high signal on output 256 of NAND gate 255 which high signal is in turn applied to the upper input of NAND gate 258. NAND gate 258 receives a high signal on its middle input from the output of comparator 244 and a high signal on its lower input via lead 252 and resistor 251 from voltage source 250. Gate 258, therefore, places a low signal on its output, which low signal is applied via lead 257 to the lower input of NAND gate 255 holding the high signal on its output 256.

Figure 3:
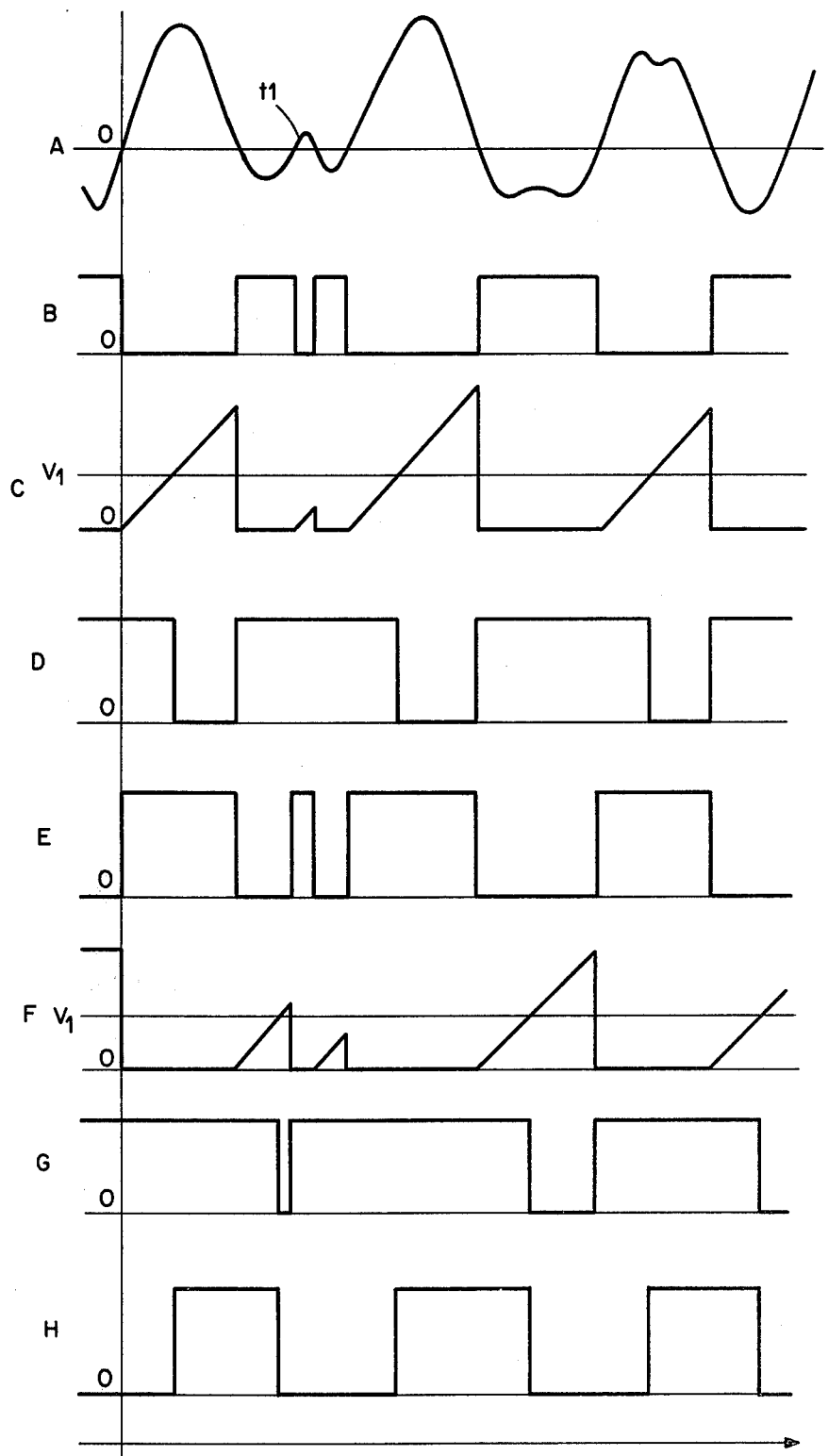
FIG. 3: Shows a plurality of voltage waveforms at selected points in FIG. 2.

The set-reset flip-flop consisting of NAND gates 255 and 258 is reset by comparator 244, which places a low signal on its output 254 when the ramp voltage developed by the integrator consisting of resistor 225 and capacitor 227 exceeds the reference voltage V1 as shown in lines F and G in FIG. 3. The low signal on the output 254 of comparator 244 is applied to the middle input of NAND gate 258. Responsive thereto, NAND gate 258 applies a high signal to its output 257 which signal is in turn applied to the lower input of NAND gate 255. Since all of the inputs of NAND gate 255 are high, it applies a low signal to its output 256 to reset the flip-flop.

Thus, for each positive pulse in the limited differentiated read signal waveform, the set-reset flip-flop is set by comparator 241. For each negative pulse the set-reset flip-flop is reset by comparator 244. The waveform produced is shown in line H and is a reproduction of the incoming limited waveform. As shown in FIG. 3, note that line H is equivalent to line E which is limited form of waveform A except that line H has been delayed by a short time interval.

However, advantageously, according to the principles of the invention, the invalid zero crossing at time $t_1$ which appears in waveforms A, B, and E has been eliminated from waveform H. This occurs, as shown in waveform C, because the invalid zero crossing has such a short time length that the output of the integrator consisting of resistor 220 and capacitor 221 does not charge to a level equivalent to reference voltage V1 during the time in which the invalid zero crossing occurs. Thus, comparator 241 does not respond to set the set-reset flip-flop. Invalid zero crossings of short time duration are thereby eliminated by the filter circuitry.

What is claimed is:

1. A filter circuit for electrically processing a voltage waveform having positive and negative portions, wherein information is contained in the pattern and spacing of zero-voltage crossings, to eliminate false zero crossings caused by noise, said circuit comprising;
   a. a first voltage comparator having positive and negative inputs, said first comparator producing an output when a voltage present at said positive input exceeds a voltage present at said negative input;
   b. means for connecting said voltage waveform to said positive input of said first comparator;
   c. means for connecting the inverse of said voltage waveform to said negative input of said first comparator means;
   d. a second voltage comparator having a positive and negative input, said second comparator producing an output when a voltage present at said positive input exceeds a voltage present at said negative input;
   e. means for connecting said voltage waveform to said negative input of said second comparator;
   f. means for connecting the inverse of said voltage waveform to said positive input of said second comparator;
   g. first integration means responsive to an output produced by said first comparator for generating a linearly increasing voltage waveform;
   h. second integration means responsive to the output of said second comparator for producing a linearly increasing voltage waveform;

i. a reference voltage source;
j. a third voltage comparator having a positive and negative input and an output, said positive input being connected to the output of said first integration means, and said negative input being connected to said reference voltage source;
k. a fourth voltage comparator having a positive and negative input and an output, said positive input being connected to the output of said second integration means, and said negative input being connected to said reference voltage source; and
l. a set-reset flip-flop having a set input and a reset input, said set input being connected to said output of said third comparator and said reset input being connected to said output of said fourth comparator.

2. A filter circuit according to claim number 1 wherein said first integration means comprises;
m. an open-collectored buffer inverter having an output and responsive to the output of said first comparator for inverting such output of said first comparator,
n. integration voltage source,
o. a resistor connecting said output of said buffer inverter to said integration voltage source, and
p. a capacitor connecting said output of said buffer inverter to ground.

3. A filter circuit according to claim 2 further comprising;
q. means for clamping the output of said first and second integration means to a predetermined voltage value to prevent overloading of said third and said fourth comparators.

4. A filter circuit according to claim 3 further comprising;
r. means for correcting said reference voltage source for voltage offsets developed by said buffer inverter and said first integration means.

* * * * *